US008375275B2

(12) United States Patent
Chen et al.

(10) Patent No.: US 8,375,275 B2
(45) Date of Patent: Feb. 12, 2013

(54) ELECTRONIC STORAGE DEVICE AND CONTROL METHOD THEREOF

(75) Inventors: Ming-Dar Chen, Chung Ho (TW); Chuan-Sheng Lin, Chung Ho (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 355 days.

(21) Appl. No.: 12/790,786

(22) Filed: May 28, 2010

(65) Prior Publication Data

US 2010/0313102 A1 Dec. 9, 2010

(30) Foreign Application Priority Data

Jun. 4, 2009 (CN) .......................... 2009 1 0033797

(51) Int. Cl.
*G11C 29/00* (2006.01)
(52) U.S. Cl. .......................... 714/773; 714/763; 714/730
(58) Field of Classification Search .................. 714/773, 714/763, 630, 721, 711
See application file for complete search history.

(56) References Cited

U.S. PATENT DOCUMENTS

| 5,027,357 | A | 6/1991 | Yu et al. | |
| 7,409,623 | B2 * | 8/2008 | Baker et al. | ................... 714/763 |
| 2008/0320214 | A1 * | 12/2008 | Ma et al. | ....................... 711/103 |
| 2009/0125764 | A1 | 5/2009 | Sung et al. | |

FOREIGN PATENT DOCUMENTS

WO  WO2006052321 A2  5/2006

* cited by examiner

*Primary Examiner* — Fritz Alphonse
(74) *Attorney, Agent, or Firm* — Cheng-Ju Chiang

(57) ABSTRACT

An electronic storage device for connecting with a host system includes a flash memory including a number of memory segments, and a controller including an error correction segment capable of generating a first correction code and a second correction code according to a written data received by the controller. The written data, the first correction code and the second correction code are written into a memory segment of the flash memory by the controller. The first correction code is used for checking whether there is an error bit in the written data, and the second correction code is used for checking and correcting said error bit in the written data.

21 Claims, 5 Drawing Sheets

ELECTRONIC STORAGE DEVICE AND CONTROL METHOD THEREOF

BACKGROUND OF THE INVENTION

1. Field of the Invention

The present invention relates to an electronic storage device and the control method thereof, more particularly to a non-volatile electronic storage device and the control method thereof.

2. Description of Related Art

NAND-type flash memory is widely used in consuming products to be served as storage media because of rapid access speed and high reliability. Conventional data storage devices are Solid-Stage Drive (SSD), USB Flash Drive (UFD), memory cards etc. In particular, NAND-Type Flash Memory is mainly served as storage media. With the rapid improvement achieved in semi-conductor process, the memory density of the flash memory becomes higher and higher, bytes capable of being stored in a memory cell become more and more, thus causing the data storage capacity of the flash memory becoming bigger and bigger. However, with the enlargement of the capacity of the flash memory, the content of data in each management unit also becomes different.

Conventional capacity of each memory unit page of a flash memory is 2 KB (Byte) plus redundancy bits, as shown in FIGS. 1A and 1B. In FIG. 1A, the memory page contains four 512-byte memory segments S0, S1, S2, and S3, with data D0, D1, D2, and D3 respectively stored in the memory segments S0, 51, S2 and S3. Error Correcting Codes (ECC) E0, E1, E2, and E3 generated according to the data D0, D1, D2 and D3 are respectively stored in the redundancy bits. In FIG. 1B, the memory page also contains four 512-byte memory segments S0, S1, S2 and S3 with data D0, D1, D2 and D3 respectively stored therein. Error Correcting Codes (ECC) E0, E1, E2 and E3 generated according to the data D0, D1, D2 and D3 are respectively recorded after corresponding memory segments S0, S1, S2 and S3.

When accessing data, such as accessing data D0, then the ECC E0 also should be accessed for error detection and correction to the data D0 to assure the right data access. For the same theory, the access to D1, D2 and D3 also should read E1, E2, and E3 for error detection and correction to error bits, thus, assuring the right data access. That means that utilizing E0, E1, E2, and E3 to assure the right access of D0, D1, D2 and D3.

Please refer to FIG. 2, the capacity of a memory page of a large-capacity flash memory is 4 KB plus redundancy bits. Each memory segment S0, S1, S2 or S3 contains 1024 bytes, that is double as 512 bytes. Each 1024-byte memory segment provides several bits of ECC for error detection and correction to the data. In FIG. 2, the data in memory segment S0 is D0 and D1 which is protected by an ECC E01. Data in memory segment S1 is D2 and D3 which is protected by an ECC E23.

However, the capacity of each memory segment of a conventional host system is still 512 bytes, not like 1024 bytes defined by a large-capacity flash memory. Therefore, when the conventional host system requests accessing 512-byte data from a large-capacity flash memory, a controller of the flash memory still needs to read out 1024 bytes and related ECC codes from the flash memory for checking error in the 1024 bytes. If there is an error, the error will be corrected and the correct requested 512-byte data will be accessed.

For example, in FIG. 2, when the host system requests accessing data D0, data in memory segment S0 (D0+D1) and the ECC code E01 generated by D0 and D1 will be all read out, that means that data D0 cannot be accessed directly. So, the additional action of reading the whole memory segment S0 and the related E01 lengthens the error detection and correction time, thus, influencing the data process efficiency of the flash memory.

BRIEF SUMMARY OF THE INVENTION

Accordingly, an object of the present invention is to provide an electronic storage device which is capable of shortening the data access time.

Another object of the present invention is to provide a control method of the electronic storage device which is capable of shortening the data access time.

In order to achieve the above-mentioned object, an electronic storage device for connecting with a host system comprises a flash memory comprising a plurality of memory segments, and a controller comprising an error correction segment capable of generating a first correction code and a second correction code according to a written data received by the controller. The written data, the first correction code and the second correction code are written into a memory segment of the flash memory by the controller. The first correction code is used for checking whether there is an error bit in the written data, and the second correction code is used for checking and correcting said error bit in the written data.

In order to achieve the above-mentioned object, a control method of accessing data in a non-volatile electronic storage device comprises the steps of receiving a written data, generating at least one first correction code and at least one second correction code according to the written data, storing the written data, the at least one first correction code and the at least one second correction code in the electronic storage device. The first correction code is capable of checking whether there is an error bit in the written data, and the second correction code is capable of checking and correcting the error bit in the written data.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
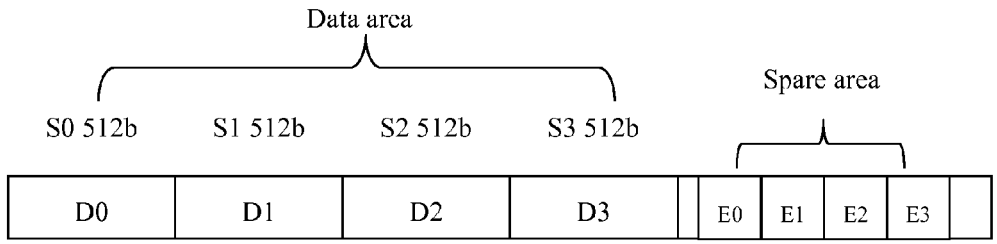
FIGS. 1A and 1B are views illustrating memory segments of a conventional small-capacity flash memory and data stored therein.
Figure 1B:
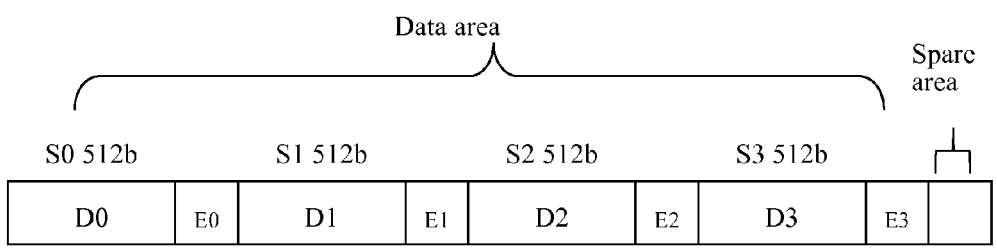

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Reference will be made to the drawing figures to describe the present invention in detail, wherein depicted elements are not necessarily shown to scale and wherein like or similar elements are designated by same or similar reference numeral through the several views and same or similar terminology.

Figure 3:
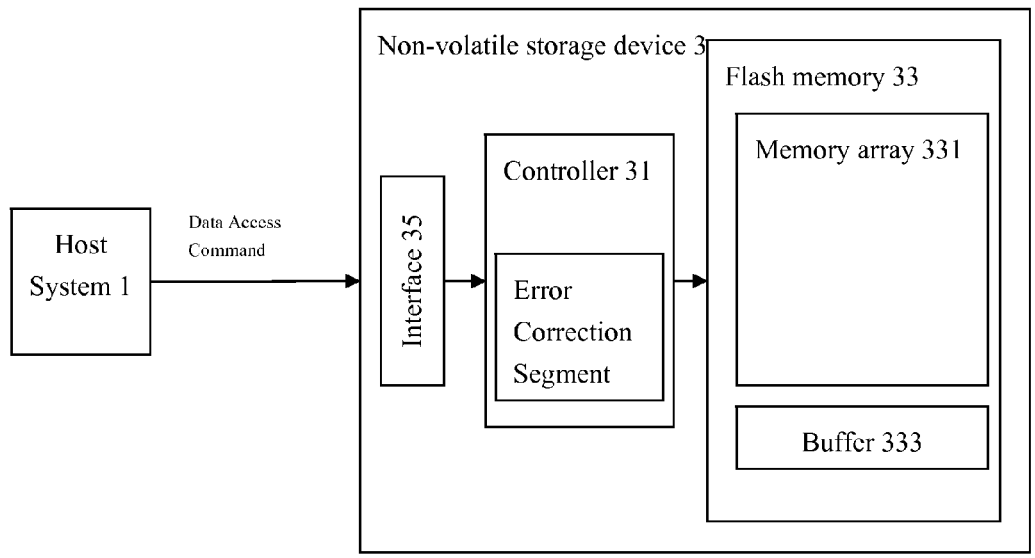
FIG. 3 is a structure chart of an electronic storage device in accordance with the present invention.

Referring to FIG. 3, a non-volatile electronic storage device 3 in accordance with the present invention comprises an interface 35 for electrically connecting a host system 1 with the electronic storage device 3, a controller 31 and a flash memory 33.

The controller 31 comprises an error correction segment 311 which can generate a first correction code and a second correction code according to data received by the controller 31. The first correction code is a Cyclical Redundancy Check code (CRC), and the second correction code is an Error Check and Correction code (ECC). The flash memory 33 comprises a memory array 331 and a buffer 333. The host system 1 sends data access command to the electronic storage device 3 via the interface 35. The controller 31 receives the data access command from the interface 35 then executes the data access command.

Figure 4:
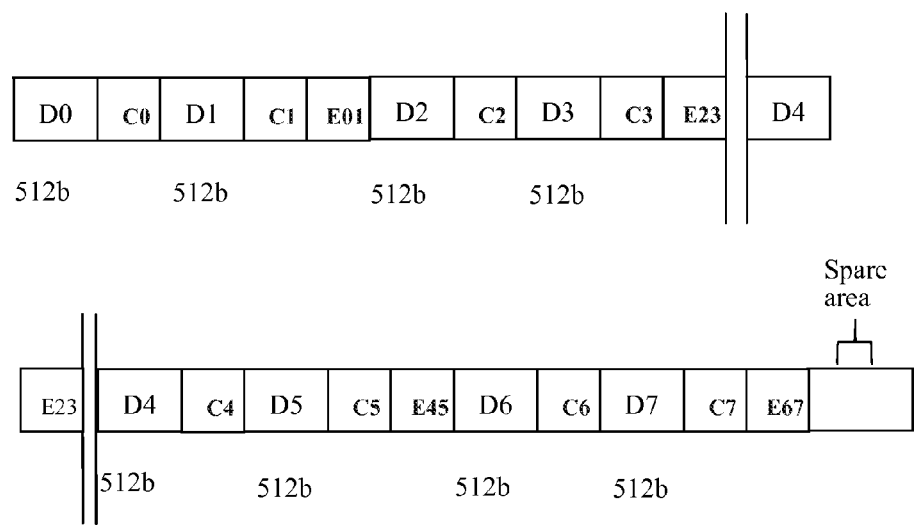
FIG. 4 is a schematic view illustrating the data stored in memory segments of the electronic storage device of the present invention.

When the controller 31 receives a data write-in command from the host system 1, the controller 31 receives the data needed to be read-in from the interface 35, and the error correction segment 311 generates CRC codes and ECC codes according to the write-in data. Then, the controller 31 sends the write-in data and the related CRC codes and ECC codes to the buffer 333 of the flash memory 33. Then, the flash memory 33 writes the data stored in the buffer 333 into the memory array 331 with the data construction as illustrated in FIG. 4. The CRC codes are generated according to every 512 bytes of the data, while, the ECC codes are generated according to every 1024 bytes of the data. Of course, the ECC codes also can be generated according to every 1024 bytes of the data and the related CRC codes.

Please refer FIG. 4, the data storage mode of the present invention is generating a CRC code after every 512 bytes, and generating an ECC code after each 1024 bytes. For example, CRC codes C0, C1 are respectively recorded after 512-byte data D0, D1, while the ECC code E01 is recorded after D0, C0, D1, C1. Therefore, when the host system 1 requests accessing data of 512 bytes, the controller 31 checks the 512-byte data and the CRC code thereof first. If there is no error, the 512-byte data will be sent out directly to the host system 1. So, there is no need to read the whole memory segment with 1024 bytes and the related ECC code, and also there is no need to check error in the whole 1024-byte data with the ECC code.

If the CRC code finds an error in the 512-byte data, then the controller 31 reads the other 512-byte data and the ECC code in the memory segment for error correction. After the error is corrected, the right 512-byte data will be sent out.

Figure 5:
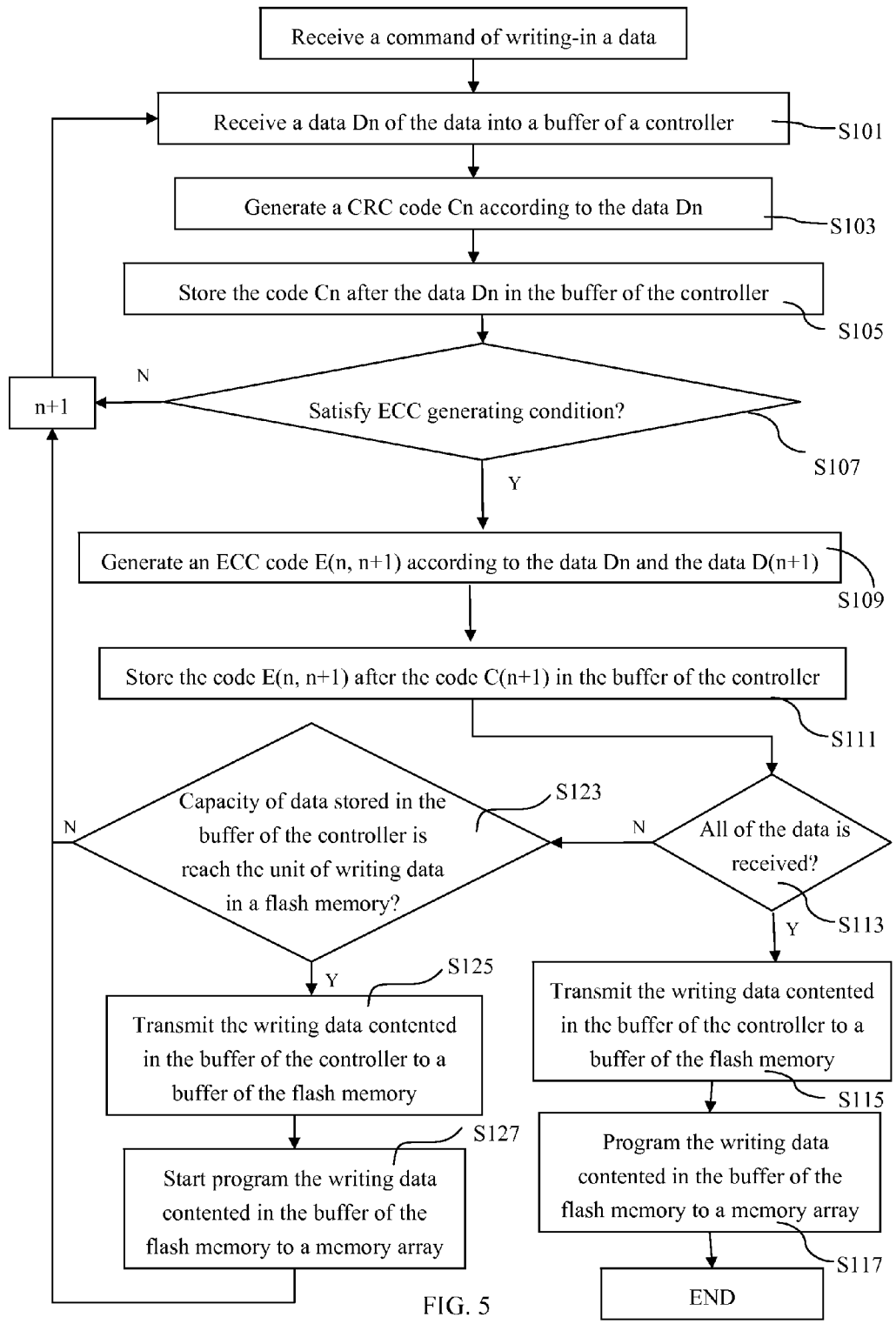
FIG. 5 is a flowchart illustrating how to write data into a flash memory of the present invention.

Please refer to FIG. 5 in combination with FIG. 4, the flowchart of how to write data from the host system 1 to the electronic storage device 3 is illustrated. The electronic storage device 3 receives the data write-in command from the host system 1, and then the controller 31 is ready for receiving data Dn from the host system 1. The controller 31 stores data Dn in the buffer (not shown) thereof (S101) and generates a CRC code Cn according to data Dn (S103). Cn is recorded after Dn (S105). Then, next data D(n+1) is received and stored in the buffer of the controller 31 after Cn. The CRC code C(n+1) generated according to D(n+1) is stored after D(n+1).

Now, the controller 31 judges that whether the memory segment which has stored data Dn and D(n+1) meets the term to generate an ECC code for protection (S107). If the term to generate an ECC code is met, the controller 31 generates an ECC code E(n, n+1) according to data Dn, D(n+1) or Dn, Cn, D(n+1), and C(n+1) (S109). E(n, n+1) is recorded after C(n+1) (S111) to protect the correctness of data Dn, D(n+1), or Dn, Cn, D(n+1), and C(n+1). Then, the controller 31 continues receiving next data and repeats the steps described above to generate corresponding CRC codes and ECC codes according to the data received (as illustrated in FIG. 4, D0, C0, D1, C1, E01, D2, C2, D3, C3, E23 . . . ).

If all the data from the host system 1 has been received and processed (S113), or not all the data has been received, but the data stored in the buffer of the controller 31 has reached the capacity of the data receiving unit of the flash memory 33 (S123), the processed written data including related CRC codes and ECC codes will be sent to the buffer 333 of the flash memory 33 (S115 or S125), then the data will be written into the memory array 331 (S117 or S127) with construction as illustrated in FIG. 4. If not all the data has not been received, the controller 31 continues receiving the rest data and executes the steps described above to finish data write-in.

Figure 2:
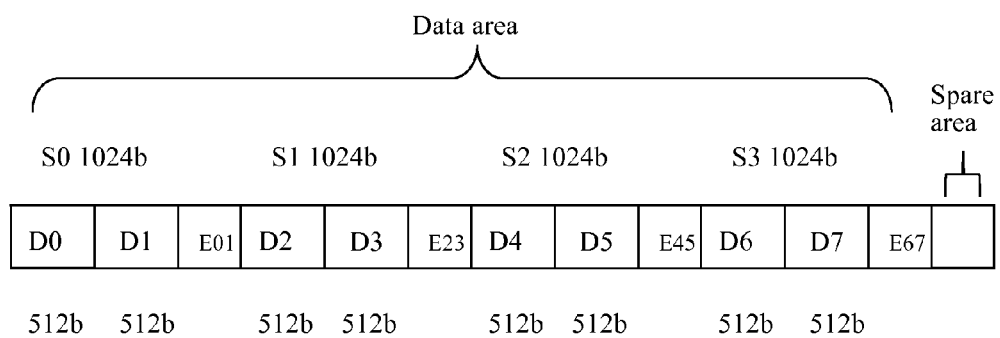
FIG. 2 is a schematic view illustrating memory segments of a conventional large-capacity flash memory and data stored therein.
Figure 6:
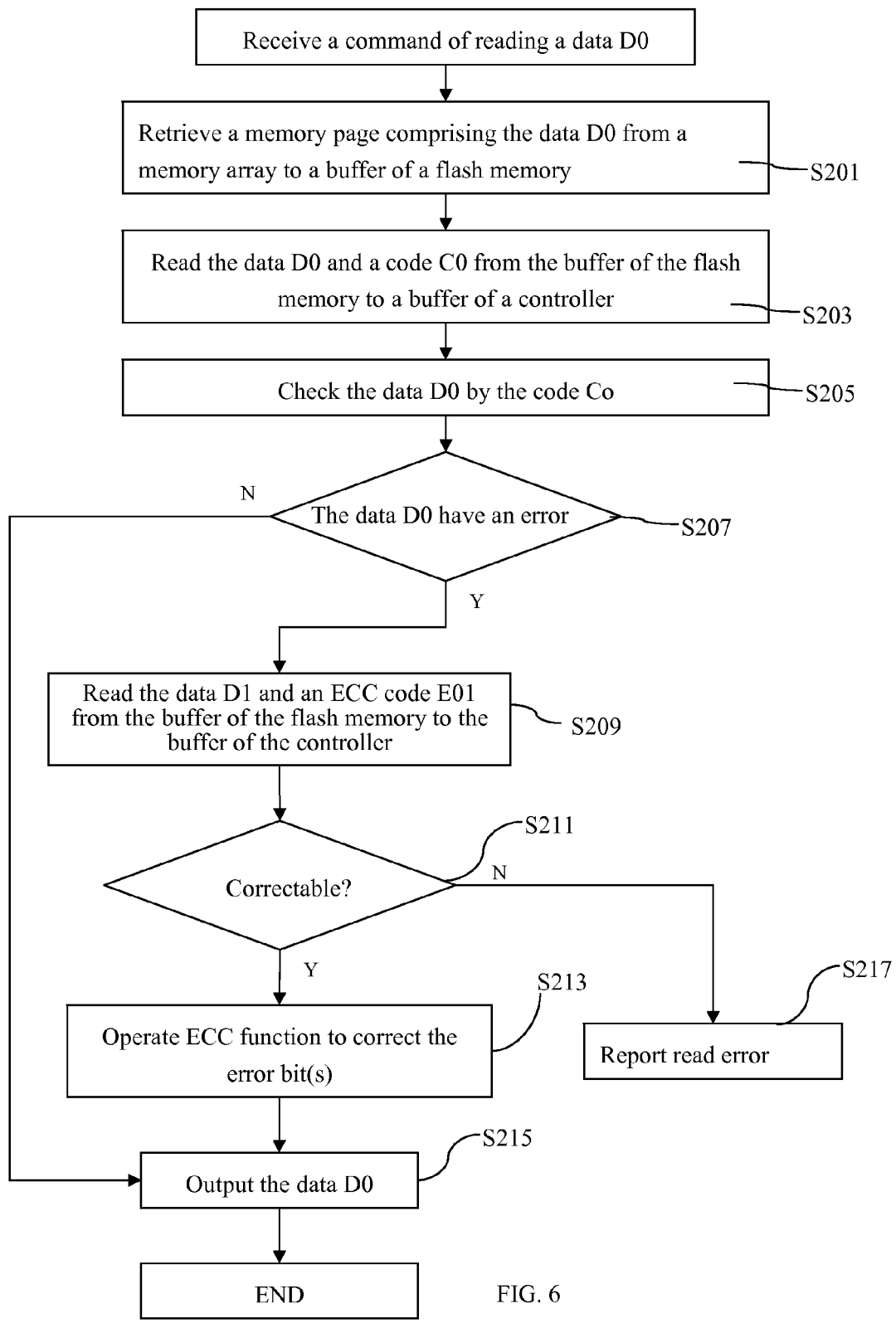
FIG. 6 is a flowchart illustrating how to read small-size data from the flash memory to a host system.

Please refer to FIGS. 4 and 6, the flowchart illustrates how to access data D0 which is smaller than the data (D0+D1 or D0+C0+D1+C1) protected by an ECC code from the non-volatile electronic storage device 3. The non-volatile electronic storage device 3 receives the data D0 access command from the host system 1, the controller 31 reads the memory page containing data D0 from the memory array 331 and stores the memory page into the buffer 333 of the flash memory 33 (S201). Of course, the data in the memory page also contains CRC code C0 of D0 and ECC code E01 (shown in FIG. 4). Then, the controller 31 reads D0 and C0 from the buffer 333 of the flash memory 33 and temporarily stores D0 and C0 into the buffer of the controller 31 (S203). Then data D0 is checked whether there is an error bit therein via CRC code C0 (S205, S207). If there is no error in D0, data D0 will be sent out to the host system 1 directly (S215). So, it is not similar to prior art (FIG. 2), which checks the error in D0 by reading D0, D1 and E01 all, therefore, the data access speed is accelerated.

If CRC code C0 finds an error bit in D0, then the controller 31 reads D1 and E01 from the buffer 333 of the flash memory 33 into the buffer of the controller 31 (S209) (or, the controller 31 reads D1, C1 and E01 from the buffer 333 of the flash memory 33 into the buffer of the controller 31 if E01 is generated according to D0, C0, D1 and C1). Then the error check and correction is executed to see whether the error bit is capable of being corrected (S211). If yes, the correction function of the ECC code will be executed to correct the error bit (S213), and the corrected data D0 will be sent out to the host system 1 (S215), or, access error will be reported (S127).

Figure 7:
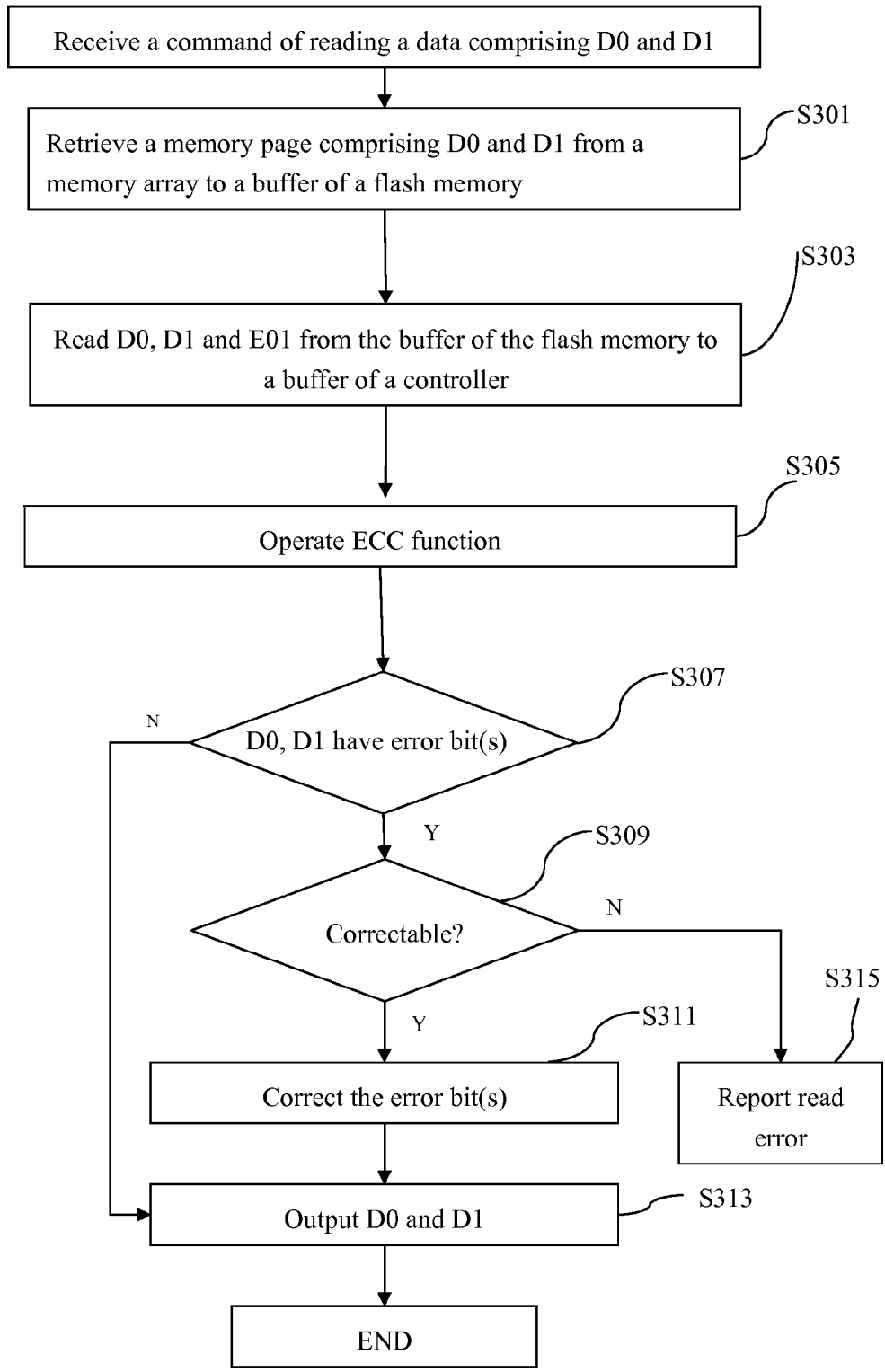
FIG. 7 is a flowchart illustrating how to read large-size data from the flash memory to the host system.

Please refer to FIGS. 4 and 7, the flowchart illustrates how to read data D0+D1 which is equal to the data protected by the ECC code from the non-volatile electronic storage device 3. The non-volatile electronic storage device 3 receives data D0+D1 access command from the host system 1, then the controller 31 reads the memory page which contains data D0 and D1 from the memory array 331 of the flash memory 33 and stores the memory page into the buffer 333 (S301). The memory page contains D0, D1 and E01 (as shown in FIG. 4). Then, the controller 31 reads D0, D1 and E01 out from the buffer 333 of the flash memory 33 and temporarily stores D0, D1 and E01 to the buffer of the controller 31 (S303). Error check and correction is then executed by E01 to execute ECC function (S305). The next step is to check whether there is an error bit in data D0, D1 (S307). If yes, the next step is to check whether the error bit is capable of being corrected (S309). If yes, correcting the error bit in data D0, D1 (S311) and then sending correct D0 and D1 to the host system 1 (S313). If there is no error bit in D0 and D1, then D0 and D1 will be sent out directly (S313). If the error bit cannot be corrected, an error report will be sent to the host system 1 (S315).

Since storage density in each unit of the large-capacity flash storage device is relatively high, of course there is a high need to ECC codes. For example, every 1024 bytes need 24-bit ECC codes for enough protection. If provide ECC code to every 512 bytes, the necessary bits needed by ECC codes for every 1024 bytes will increase a lot because it is impossible to ensure that error bits will distribute evenly in the two 512 bytes in the 1024-byte memory segment (that means it is impossible that only 12-bit error occurs in the 512 bytes, it is possible to occur an error more than 12 bits).

If provide 16-bit ECC code to every 512 bytes (actually, it still has risk to utilize 16-bit ECC code, because it is still possible to occur an error more than 16 bits in 512 bytes), then it is necessary to provide ECC code with 416 bits to every 1024 bytes (16*13*2=416). In such situation, the ECC codes occupy a lot of additional redundancy bits, even it is possible that no enough space to storage such large ECC codes in the redundancy space of the flash storage device. The present invention provides a CRC code for every 512 bytes for checking error bits which only occupy 2 groups equal to 2*8=16 bits. So, the bits needed for every 1024 bytes in the present invention are equal to 24*14+16=352 bits.

In summary, the present invention utilizes an ECC code to protect data bigger than 512 bytes, and utilizes an additional CRC code to protect small-size data. That means, if there is no error in a small-size 512-byte data, the additional CRC code is capable of checking whether the small-size data is right to accelerate the accessing speed and assuring the enough error detection and correction capability at the same time.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, it is not restricted to a flash memory which is one kind of non-volatile storage device, for a person skilled in this field, other kinds of non-volatile storage devices, such as EPROM (Erasable Programmable Read Only Memory), EEPROM (Electrically Erasable Programmable Read Only Memory), PRAM (Phase-change Random Access Memory), MARM (Magnetic Random Access Memory), and FRAM (Ferroelectric Random Access Memory), are still within the principles of the invention to the full extent indicated by the broad general meaning of the terms in which the appended claims are expressed.

We claim:

1. A non-volatile electronic storage device adapted for connecting with a host system, comprising:
    a flash memory comprising a plurality of memory segments; and
    a controller comprising an error correction segment capable of generating a first correction code and a second correction code according to a written data received by the controller;
    wherein the written data, the first correction code and the second correction code are written into a memory segment of the flash memory by the controller; and
    wherein the first correction code is used for checking whether there is an error bit in the written data, and the second correction code is used for checking and correcting said error bit in the written data;
    wherein if the written data is bigger than 512 bytes, the controller reads the written data, related first correction code and the second correction code out, and wherein the second correction code is used to check whether there is an error bit in the written data.

2. The electronic storage device as claimed in claim 1, wherein the first correction code is generated according to every 512 bytes of the written data.

3. The electronic storage device as claimed in claim 1, wherein the second correction code is generated according to every 1024 bytes of the written data.

4. The electronic storage device as claimed in claim 1, wherein the second correction code is generated according to every 1024 bytes of the written data and the related first correction code.

5. The electronic storage device as claimed in claim 1, wherein the first correction code is a Cyclical Redundancy Check (CRC) code, and wherein the second correction code is an Error Check and Correction (ECC) code.

6. The electronic storage device as claimed in claim 1, wherein if the written data is no bigger than 512 bytes, the controller only reads the written data and the related first correction code, and utilizes the first correction code to check whether there is an error bit in the written data.

7. The electronic storage device as claimed in claim 6, wherein the controller sends the written data out directly if there is no error bit checked by the first correction code, and wherein the controller utilizes the second correction code to correct an error bit if there is an error bit checked by the first correction code.

8. The electronic storage device as claimed in claim 7, wherein the controller sends an error report out if the second correction code cannot correct the error.

9. The electronic storage device as claimed in claim 1, wherein the controller sends the data out directly if there is no error bit checked by the second correction code, or the controller utilizes the second correction code to correct the error bit if there is an error bit checked by the second correction code.

10. The electronic storage device as claimed in claim 9, wherein the controller sends an error report out if the second correction code cannot correct the error.

11. A control method of accessing data in a non-volatile electronic storage device, comprising the steps of:
    receiving a written data;

generating at least one first correction code and at least one second correction code according to the written data;

reading the written data and the related first correction code and using the first correction code to check whether there is an error bit in the written data if the written data is no bigger than 512 bytes; and storing the written data, the at least one first correction code and the at least one second correction code in the electronic storage device;

wherein the first correction code is capable of checking whether there is an error bit in the written data, and the second correction code is capable of checking and correcting the error bit in the written data.

12. The control method of the electronic storage device as claimed in claim 11, wherein the step of generating the first correction code further comprises generating the first correction code according to every 512 bytes of the written data.

13. The control method of the electronic storage device as claimed in claim 11, wherein the step of generating the second correction code further comprises generating the second correction code according to every 1024 bytes of the written data.

14. The control method of the electronic storage device as claimed in claim 11, wherein the step of generating the second correction code further comprises generating the second correction code according to every 1024 bytes of the written data and the related first correction code.

15. The control method of the electronic storage device as claimed in claim 11, wherein the first correction code is a Cyclical Redundancy Check (CRC) code, and wherein the second correction code is an Error Check and Correction (ECC) code.

16. The control method of the electronic storage device as claimed in claim 11, further comprising a step of sending the written data out directly if there is no error bit checked by the first correction code, and wherein the second correction code is used to correct the error bit if there is an error bit in the written data checked by the first correction code.

17. The control method of the electronic storage device as claimed in claim 16, further comprising a step of sending an error report if the error bit cannot be corrected by the second correction code.

18. The control method of the electronic storage device as claimed in claim 11, further comprising a step of reading the written data, the related first correction code and second correction code, and wherein the second correction code is used to check whether there is an error bit in the written data if the written data is larger than 512 bytes.

19. The control method of the electronic storage device as claimed in claim 18, further comprising a step of sending the written data out directly if there is no error bit checked by the second correction code, and wherein the second correction code is used to correct the error bit if there is an error bit checked by the second correction code.

20. The control method of the electronic storage device as claimed in claim 19, further comprising a step of sending an error report if the error bit cannot be corrected by the second correction code.

21. A non-volatile electronic storage device adapted for connecting with a host system, comprising:

a flash memory comprising a plurality of memory segments; and a controller comprising an error correction segment capable of generating a first correction code and a second correction code according to a written data received by the controller;

wherein the written data, the first correction code and the second correction code are written into a memory segment of the flash memory by the controller; and wherein the first correction code is used for checking whether there is an error bit in the written data, and the second correction code is used for checking and correcting said error bit in the written data;

wherein if the written data is no bigger than 512 bytes, the controller only reads the written data and the related first correction code, and utilizes the first correction code to check whether there is an error bit in the written data.

* * * * *